(12) United States Patent
Wu et al.

(10) Patent No.: US 11,621,024 B2
(45) Date of Patent: Apr. 4, 2023

(54) CALIBRATION DEVICE

(71) Applicants: Jiangsu Advanced Memory Technology Co., Ltd., Jiangsu (CN); Siloam Holdings Co., Ltd., Hsinchu County (TW)

(72) Inventors: Jui-Jen Wu, Hsinchu County (TW); Toshio Sunaga, Hsinchu County (TW); Cho-Fan Chen, Hsinchu County (TW)

(73) Assignees: JIANGSU ADVANCED MEMORY TECHNOLOGY CO., LTD., Jiangsu (CN); SILOAM HOLDINGS CO., LTD., Hsinchu (TW)

( * ) Notice: Subject to any disclaimer, the term of this patent is extended or adjusted under 35 U.S.C. 154(b) by 0 days.

(21) Appl. No.: 17/239,709

(22) Filed: Apr. 26, 2021

(65) Prior Publication Data

US 2022/0293142 A1  Sep. 15, 2022

(30) Foreign Application Priority Data

Mar. 15, 2021  (CN) .......................... 202110274807.4

(51) Int. Cl.
*G11C 7/10* (2006.01)
*G06F 1/14* (2006.01)
*G11C 29/02* (2006.01)

(52) U.S. Cl.
CPC .............. *G11C 7/1072* (2013.01); *G06F 1/14* (2013.01); *G11C 7/1057* (2013.01); *G11C 29/028* (2013.01)

(58) Field of Classification Search
CPC ....... G06F 1/14; G11C 7/1072; G11C 7/1057; G11C 7/1084; G11C 29/08

USPC ..................................................... 365/233.13
See application file for complete search history.

(56) References Cited

U.S. PATENT DOCUMENTS

| | | | | |
|---|---|---|---|---|
| 7,642,808 B2* | 1/2010 | Jeong | ..................... | H04L 25/028 326/26 |
| 7,839,159 B2* | 11/2010 | Nakamura | .......... | H04L 25/0278 324/755.07 |
| RE44,617 E * | 12/2013 | Lee | ..................... | H03K 19/0005 326/30 |
| 8,953,409 B2* | 2/2015 | Ishikawa | ............... | G11C 11/406 365/194 |
| 10,069,495 B2* | 9/2018 | Jung | ................... | G11C 11/4085 |
| 11,145,355 B2* | 10/2021 | Kim | ..................... | G11C 7/1051 |
| 11,190,185 B2* | 11/2021 | Choi | .............. | H03K 19/018585 |
| 2009/0146685 A1* | 6/2009 | Kim | ................... | H03K 19/0005 324/601 |

* cited by examiner

*Primary Examiner* — Son L Mai
(74) *Attorney, Agent, or Firm* — CKC & Partners Co., LLC

(57) ABSTRACT

A calibration device which is configured for calibrating a memory is provided. The calibration device includes an input terminal, a first pull-up circuit, and a first comparator. The input terminal is coupled to an external resistor. The first pull-up circuit is coupled to the input terminal, and configured to receive a power supply voltage. The first pull-up circuit includes a plurality of first pull-up units. The first pull-up units are coupled to each other in parallel. The first comparator is coupled to the input terminal. The first comparator is configured to receive a proportion voltage which is corresponding to the power supply voltage, and output a first control signal to the first pull-up units, such that a resistance of each of the first pull-up units is equal to a resistance of the external resistor.

9 Claims, 3 Drawing Sheets

CALIBRATION DEVICE

RELATED APPLICATIONS

This application claims priority to and the benefit of China Application Serial Number 202110274807.4, filed on Mar. 15, 2021, the entire contents of which are incorporated herein by reference as if fully set forth below in its entirety and for all applicable purposes.

BACKGROUND

Field of Invention

The present disclosure relates to a calibration device. More particularly, the present disclosure relates to a calibration device for calibrating memory.

Description of Related Art

With the progress of the technology, Double Data Rate Synchronous Dynamic Random Access Memory (DDR SDRAM) is widely used in electronic products. DDR uses high frequency signals. If DDR is not calibrated to let the DDR and the external device achieve impedance matching, and the reflection condition of the high frequency signals generated by DDR will easily occur.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

A calibration device is provided. The calibration device includes an input terminal, a first pull-up circuit, and a first comparator. The input terminal is coupled to an external resistor. The first pull-up circuit is coupled to the input terminal, and configured to receive a power supply voltage. The first pull-up circuit includes a plurality of first pull-up units. The first pull-up units are coupled to each other in parallel. The first comparator is coupled to the input terminal. The first comparator is configured to receive a proportion voltage which is corresponding to the power supply voltage, and output a first control signal to the first pull-up units, such that a resistance of each of the first pull-up units is equal to a resistance of the external resistor.

In some embodiments, the first comparator negatively feeds back the proportion voltage to the input terminal, and the first pull-up circuit is adjusted according to the proportion voltage and the first control signal, such that the resistance of each of the first pull-up units is equal to the resistance of the external resistor.

In some embodiments, the calibration device further includes a second pull-up circuit, a first pull-down circuit, and a second comparator. The second pull-up circuit is configured to receive the first control signal and the power supply voltage. The second pull-up circuit includes a plurality of second pull-up units. The second pull-up units are coupled to each other in parallel. The first pull-down circuit is coupled to the second pull-up circuit at a first node. The first pull-down circuit includes at least one first pull-down unit. The second comparator is configured to receive the proportion voltage which is corresponding to the power supply voltage, provide the proportion voltage to the first node, and output a second control signal to the at least one first pull-down unit, such that a resistance of each of the second pull-up units is equal to the resistance of the external resistor, and a resistance of the first pull-down circuit is equal to the resistance of the external resistor.

In some embodiments, the second comparator negatively feeds back the proportion voltage to the first node, and the second pull-up circuit is adjusted according to the proportion voltage and the first control signal, such that the resistance of each of the second pull-up units is equal to the resistance of the external resistor.

In some embodiments, the second comparator negatively feeds back the proportion voltage to the first node, and the first pull-down circuit is adjusted according to the proportion voltage and the second control signal, such that the resistance of the first pull-down circuit is equal to the resistance of the external resistor.

In some embodiments, a number of the at least one first pull-down unit is plural, wherein the first pull-down units are coupled to each other in parallel, wherein the second comparator outputs the second control signal to the first pull-down units, such that an equivalent resistance of the first pull-down units, which are coupled to each other in parallel, is equal to the resistance of the external resistor.

In some embodiments, the calibration device includes a third pull-up circuit and a second pull-down circuit. The third pull-up circuit is configured to receive the power supply voltage. The second pull-down circuit is coupled to the third pull-up circuit at a second node. The first comparator outputs the first control signal to the third pull-up circuit, such that a resistance of the third pull-up circuit is equal to the resistance of the external resistor. The second comparator outputs the second control signal to the second pull-down circuit, such that a resistance of the second pull-down circuit is equal to the resistance of the external resistor.

In some embodiments, a voltage of the second node is the proportion voltage corresponding to the power supply voltage.

In some embodiments, the second pull-down circuit comprises a plurality of second pull-down units, wherein the second pull-down units are coupled to each other in parallel, wherein the second comparator outputs the second control signal to the second pull-down units, such that an equivalent resistance of the second pull-down units, which are coupled to each other in parallel, is equal to the resistance of the external resistor.

In some embodiments, the proportion voltage is 10%~90% of the power supply voltage.

Therefore, based on the technical content of the present disclosure, the embodiment of the present disclosure provides a calibration device so as to calibrate a memory by the calibration device, such that the memory and the external device achieve impedance matching, and the reflection condition of the high frequency signal generated by the memory can be improved. In addition, compared with using digital control circuit that need to output the calibrating signal at short intervals (e.g., output the calibrating signal every few seconds), the embodiment of the present disclosure may provide a continuous and immediate calibration manner by using analogy circuit to calibrate the resistances of the pull-up units and the pull-down units. In addition, compared with using digital control circuit that has quantization error, the embodiment of the present disclosure uses analogy circuit to preform calibration such that the quantization error will not occur.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
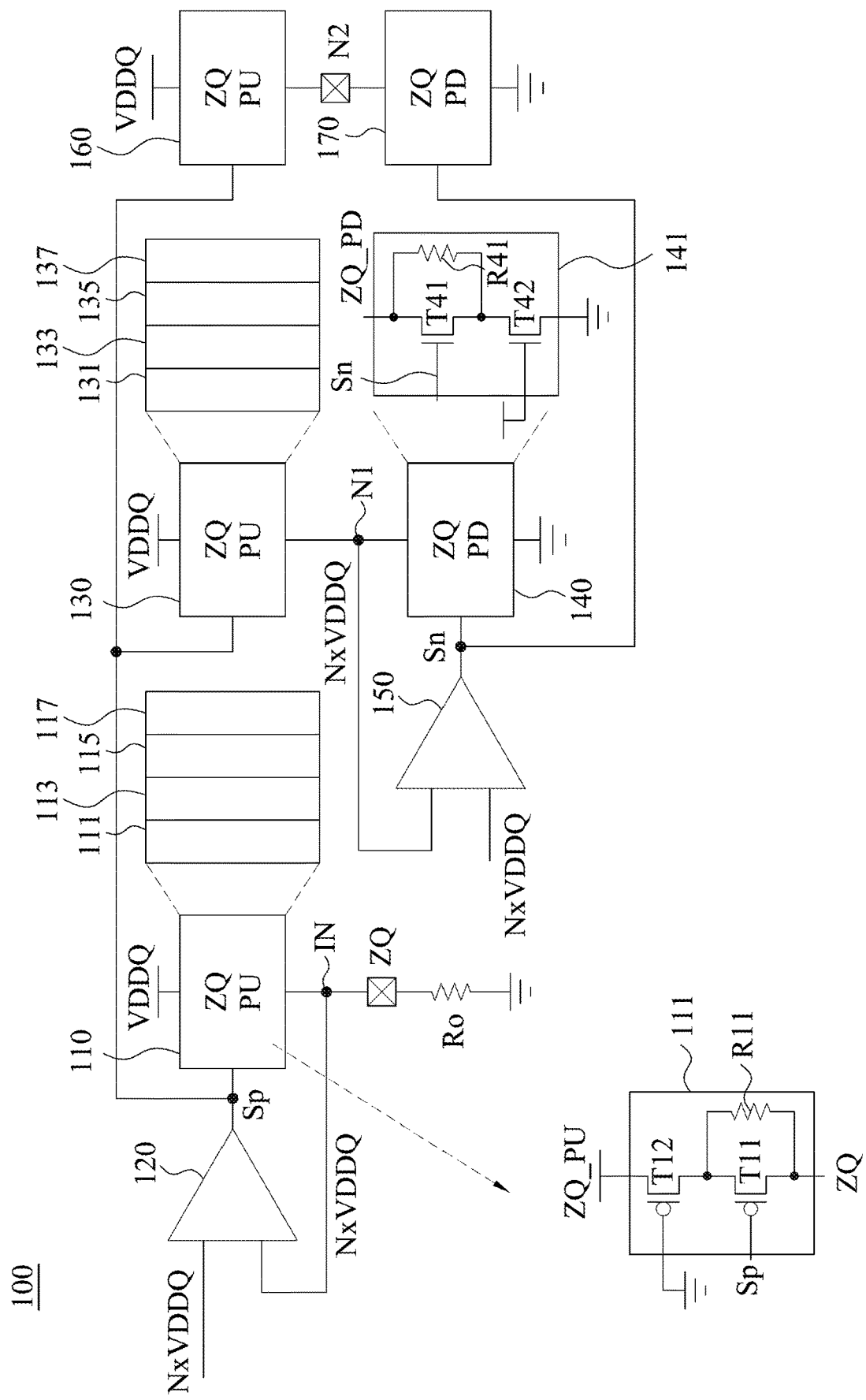
FIG. 1 depicts a schematic diagram of a calibration device according to some embodiments of the present disclosure.

FIG. 1 depicts a schematic diagram of a calibration device 100 according to some embodiments of the present disclosure. The calibration device 100 is used to calibrate a memory (now shown). The calibration device 100 includes an input terminal IN, a first pull-up circuit 110, and a first comparator 120.

Figure 2:
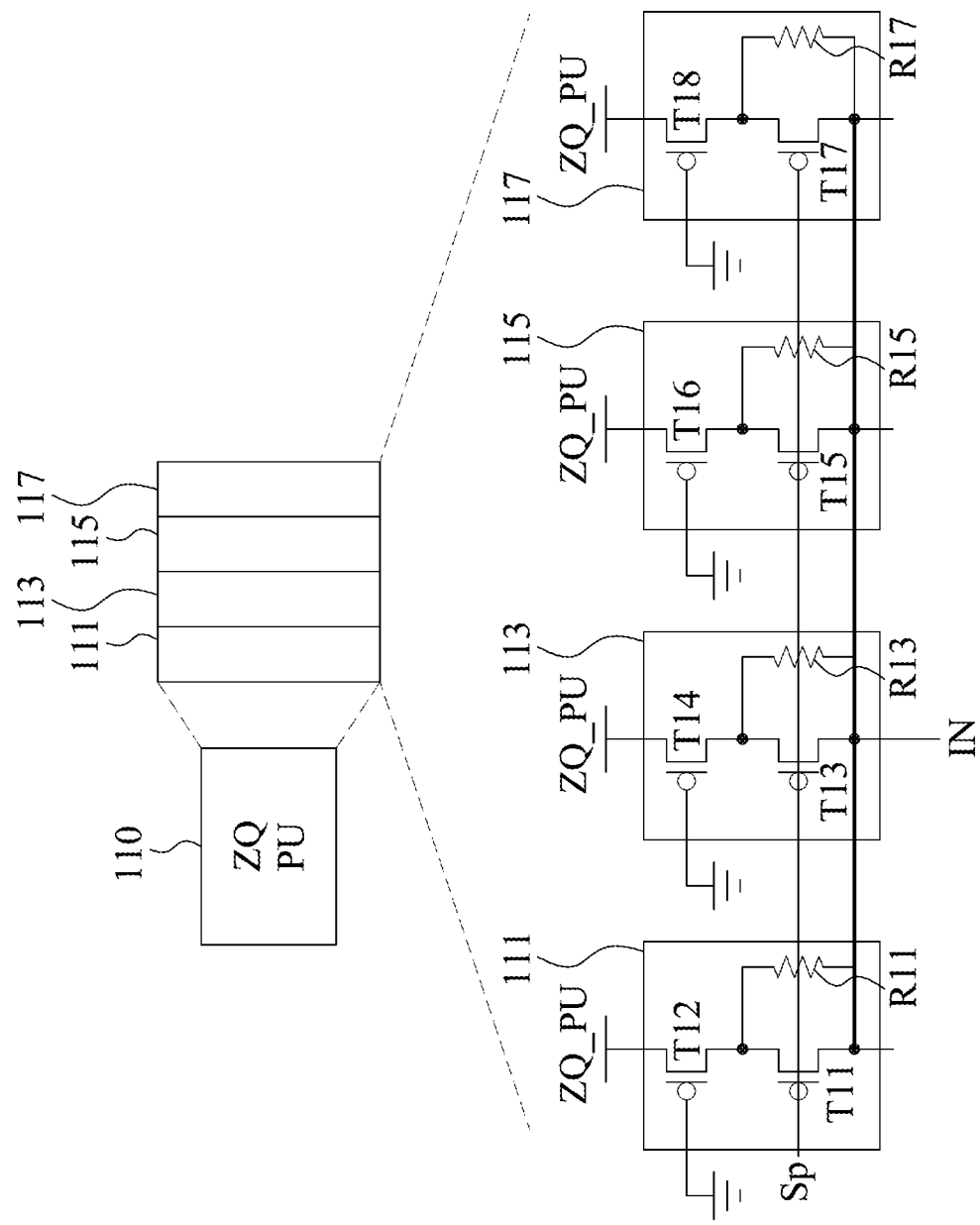
FIG. 2 depicts a schematic diagram of a pull-up circuit of the calibration device shown in FIG. 1 according to some embodiments of the present disclosure.

As shown in the figure, the input terminal IN is coupled to the external resistor Ro. The first pull-up circuit 110 is coupled to the input terminal IN, and configured to receive a power supply voltage VDDQ. The first pull-up circuit 110 includes a plurality of first pull-up units 111, 113, 115, 117, and these first pull-up units 111, 113, 115, 117 are coupled to each other in parallel. In one embodiment, the structure of the first pull-up units 111, 113, 115, 117, which are coupled to each other in parallel, can be seen in the following FIG. 2.

Referring to FIG. 1, an input terminal of the first comparator 120 is coupled to the input terminal IN, and the other input terminal of the first comparator 120 receives a proportion voltage N*VDDQ which is corresponding to the power supply voltage VDDQ. A first control signal Sp is provided to the first pull-up units 111, 113, 115, 117 of the first pull-up circuit 110 through an output terminal of the first comparator 120, such that a resistance of each of the first pull-up units 111, 113, 115, 117 is equal to a resistance of the external resistor Ro.

For example, the calibration device 100 can be disposed in the memory (on chip), and the external resistor Ro can be a precision calibration resistor. When preforming a memory calibration, the external resistor Ro is coupled to the input terminal IN of the calibration device 100. At this time, since the first comparator 120 is connected in a negative feedback way to form virtual short, the proportion voltage N*VDDQ received by the first comparator 120 will be transmitted to the input terminal IN, such that the voltage value of the input terminal IN is N*VDDQ. Besides, the first comparator 120 outputs the first control signal Sp to the first pull-up circuit 110, and the first pull-up circuit 110 is adjusted according to the proportion voltage N*VDDQ and the first control signal Sp, such that the resistance of each of the first pull-up units 111, 113, 115, 117 of the first pull-up circuit 110 is equal to the resistance of the external resistor Ro.

Assume that the value of the external resistor Ro is 240 ohms($\Omega$), and the proportion voltage is 0.8VDDQ. When the external resistor Ro is coupled to the input terminal IN, the first comparator 120 negatively feeds back the proportion voltage 0.8VDDQ to the input terminal IN, such that the voltage value of the input terminal IN is 0.8VDDQ. At this time, the first pull-up circuit 110 is adjusted according to the power supply voltage VDDQ, the proportion voltage 0.8VDDQ, and the first control signal Sp, such that resistances of the first pull-up unit 111, the first pull-up unit 113, the first pull-up unit 115, and the first pull-up unit 117 of the first pull-up circuit 110 are all 240 ohms. Therefore, the resistance of each of the first pull-up units 111, 113, 115, 117 is equal to the resistance of the external resistor, which is 240 ohms. However, the present disclosure is not limited to the above-mentioned embodiments in FIG. 1, and it is merely an example for illustrating one of the implements of the present disclosure. It will be apparent to those skilled in the art that other suitable external resistors and other suitable proportion voltages can be used in the present disclosure without departing from the scope or spirit of the present disclosure. For example, the proportion voltage can be 10%~90% of the power supply voltage depending on actual requirements.

In one embodiment, the first pull-up unit 111 can be implemented by the circuit 111 at the lower-left corner in the figure. The first pull-up unit 111 may include transistors T11, T12 and a resistor R11. The transistors T11, T12 are coupled to each other in series, and the resistor R11 is coupled to the transistor T11 in parallel. The transistor T11 is configured to receive the first control signal Sp to adjust the resistance of the first pull-up unit 111.

Referring to FIG. 1, the calibration device 100 further includes a second pull-up circuit 130, a first pull-down circuit 140, and a second comparator 150. The second pull-up circuit 130 is configured to receive the first control signal Sp and the power supply voltage VDDQ. The second pull-up circuit 130 includes a plurality of second pull-up units 131, 133, 135, 137, and these second pull-up units 131, 133, 135, 137 are coupled to each other in parallel. The second pull-up circuit 130 and the first pull-down circuit 140 are coupled to the first node N1. The first pull-down circuit 140 includes at least one first pull-down unit 141. A first terminal of the second comparator 150 is configured to receive a proportion voltage N*VDDQ which is corresponding to the power supply voltage VDDQ. The second comparator 150 is connected in a negative feedback way, such that a second terminal of the second comparator 150 provides the proportion voltage N*VDDQ to the first node N1. The second comparator 150 outputs a second control signal Sn to the at least one first pull-down unit 141, such that a resistance of each of the second pull-up units 131, 133, 135, 137 is equal to a resistance of the at least one first pull-down unit 141. In one embodiment, the resistance of the at least one first pull-down unit 141 is equal to the resistance of the external resistor Ro.

For example, when preforming a memory calibration, the external resistor Ro shall be coupled to the input terminal IN of the calibration device 100. At this time, the first comparator 120 will generate the above-mentioned first control signal Sp and transmit it to the second pull-up circuit 130. In addition, since the second comparator 150 is virtual short, the proportion voltage N*VDDQ received by the second comparator 150 will be transmitted to the first node N1, such that the voltage value of the first node N1 is N*VDDQ. The second pull-up circuit 130 will be adjusted according to the proportion voltage N*VDDQ and the first control signal Sp, such that the resistance of each of the second pull-up units 131, 133, 135, 137 is equal to the resistance of the external resistor Ro. Besides, the second comparator 150 outputs the second control signal Sn to the first pull-down circuit 140, the first pull-down circuit 140 will be adjusted according to the proportion voltage N*VDDQ and the second control signal Sn, such that the resistance of the at least one first pull-down unit 141 of the first pull-down circuit 140 is equal to the resistance of the external resistor Ro.

Assume that the value of the external resistor Ro is 240 ohms(Ω), and the proportion voltage is 0.8VDDQ. When the external resistor Ro is coupled to the input terminal IN, the second comparator 150 negatively feeds back the proportion voltage 0.8VDDQ to the first node N1, such that the voltage value of the first node N1 is 0.8VDDQ. At this time, the second pull-up circuit 130 is adjusted according to the power supply voltage VDDQ, the proportion voltage 0.8VDDQ, and the first control signal Sp, such that the resistances of the second pull-up unit 131, the second pull-up unit 133, the second pull-up unit 135, and the second pull-up unit 137 of the second pull-up circuit 130 are all 240 ohms. Therefore, the resistance of each of the second pull-up units 131, 133, 135, 137 is equal to the resistance of the external resistor, which is 240 ohms. In addition, the first pull-down circuit 140 is adjusted according to the proportion voltage 0.8VDDQ and the second control signal Sn, such that the resistance of the at least one first pull-down unit 141 of the first pull-down circuit 140 is 240 ohms, which is equal to the resistance of the external resistor (240 ohms).

In one embodiment, the first pull-down unit 141 can be implemented by the circuit 141 at the lower-right corner in the figure. The first pull-down unit 141 may include transistors T41, T42 and a resistor R41. The transistors T41, T42 are coupled to each other in series, and the resistor R41 is coupled to the transistor T41 in parallel. The transistor T41 is configured to receive the second control signal Sn to adjust the resistance of the first pull-down unit 141.

Figure 3:
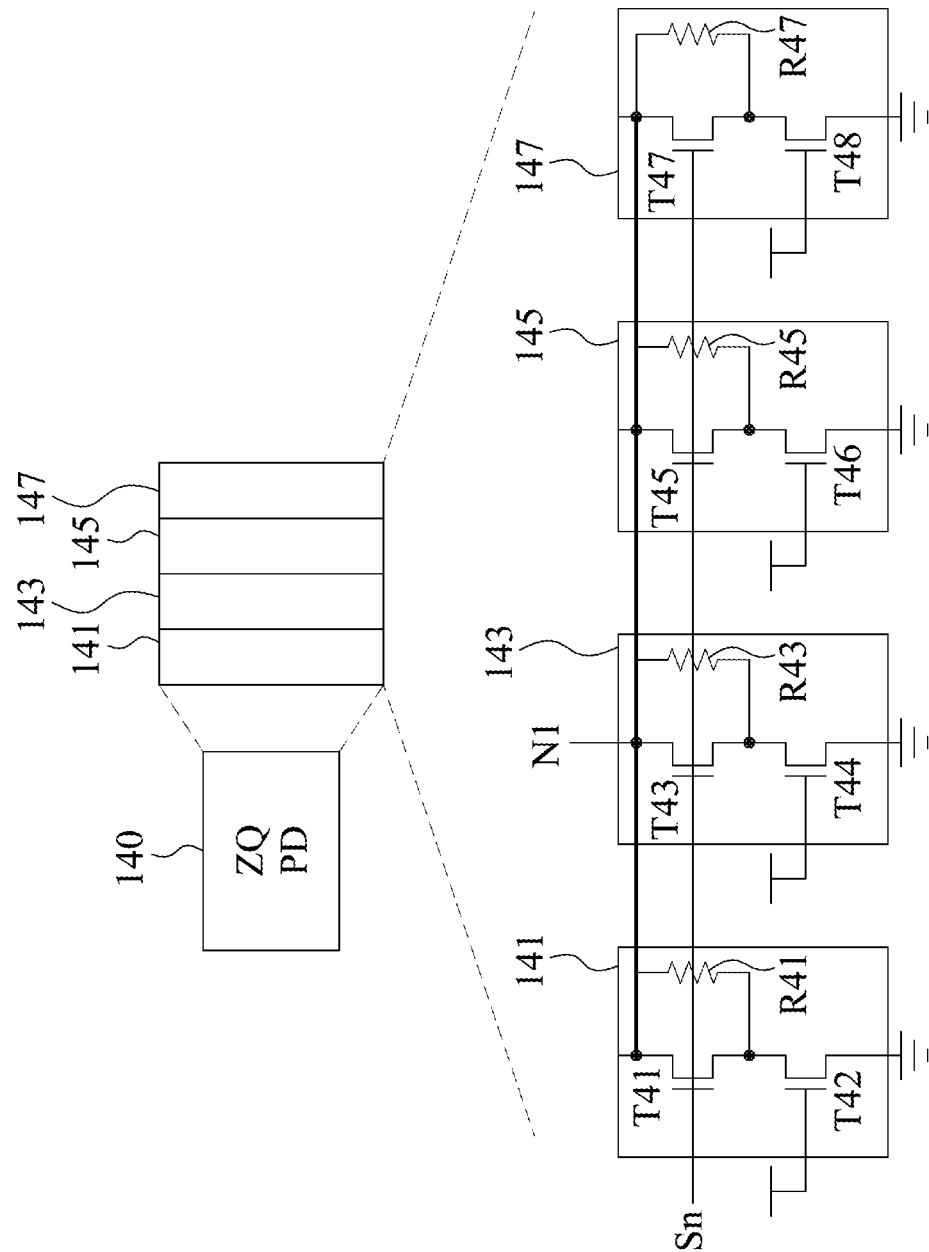
FIG. 3 depicts a schematic diagram of a pull-down circuit of the calibration device shown in FIG. 1 according to some embodiments of the present disclosure.

FIG. 3 depicts a schematic diagram of the pull-down circuit 140 of the calibration device 100 shown in FIG. 1 according to some embodiments of the present disclosure. As shown in the figure, a number of the first pull-down unit 141 is plural, these first pull-down units 141, 143, 145, 147 are coupled to each other in parallel. The second comparator 150 outputs the second control signal Sn to the first pull-down units 141, 143, 145, 147, such that the equivalent resistance of the first pull-down units 141, 143, 145, 147, which are coupled to each other in parallel, is equal to the resistance of the external resistor Ro.

Referring to FIG. 1, in one embodiment, the calibration device 100 further includes a third pull-up circuit 160 and a second pull-down circuit 170. The third pull-up circuit 160 is configured to receive the power supply voltage VDDQ. The second pull-down circuit 170 and the third pull-up circuit 160 are coupled at a second node N2. The first comparator 120 outputs the first control signal Sp to the third pull-up circuit 160, such that the resistance of the third pull-up circuit 160 is equal to the resistance of the second pull-up circuit 130. The second comparator 150 outputs the second control signal Sn to the second pull-down circuit 170, such that the resistance of the second pull-down circuit 170 is equal to the resistance of the external resistor Ro.

In one embodiment, since the bias conditions of the third pull-up circuit 160 and the second pull-down circuit 170 are the same as the bias conditions of the pull-up circuits 110, 130 and the pull-down circuit 140, the voltage of the second node N2 is the proportion voltage N*VDDQ which is corresponding to the power supply voltage VDDQ. In one embodiment, the proportion voltage is 0.8VDDQ.

Referring to both FIG. 1 and FIG. 3, the second pull-down circuit 170 may include a plurality of second pull-down units as shown in FIG. 3, and these second pull-down units are coupled to each other in parallel. The second comparator 150 outputs second control signal Sn to the second pull-down units of the second pull-down circuit 170, such that an equivalent resistance of the second pull-down units, which are coupled to each other in parallel, of the second pull-down circuit 170 is equal to the resistance of the external resistor Ro.

It can be understood from the embodiments of the present disclosure that application of the present disclosure has the following advantages. The embodiment of the present disclosure provides a calibration device so as to calibrate a memory by the calibration device, such that the memory and the external device achieve impedance matching, and the reflection condition of the high frequency signal generated by the memory can be improved. In addition, compared with using digital control circuit that need to output the calibrating signal at short intervals (e.g., output the calibrating signal every few seconds), the embodiment of the present disclosure may provide a continuous and immediate calibration manner by using analogy circuit to calibrate the resistances of the pull-up units and the pull-down units. In addition, compared with using digital control circuit that has quantization error, the embodiment of the present disclosure uses analogy circuit to preform calibration such that the quantization error will not occur.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A calibration device, for calibrating a memory, comprising:
an input terminal, coupled to an external resistor;
a first pull-up circuit, coupled to the input terminal, and configured to receive a power supply voltage, comprising:
a plurality of first pull-up units, wherein the first pull-up units are coupled to each other in parallel; and
a first comparator, coupled to the input terminal, wherein the first comparator is configured to receive a proportion voltage which is corresponding to the power supply voltage, and output a first control signal to the first pull-up units, such that a resistance of each of the first pull-up units is equal to a resistance of the external resistor;
a second pull-up circuit, configured to receive the first control signal and the power supply voltage, comprising:
a plurality of second pull-up units, wherein the second pull-up units are coupled to each other in parallel;
a first pull-down circuit, coupled to the second pull-up circuit at a first node, comprising:
at least one first pull-down unit; and
a second comparator, configured to receive the proportion voltage which is corresponding to the power supply voltage, provide the proportion voltage to the first node, and output a second control signal to the at least one first pull-down unit, such that a resistance of each of the second pull-up units is equal to the resistance of the external resistor, and a resistance of the first pull-down circuit is equal to the resistance of the external resistor.

2. The calibration device of claim 1, wherein the first comparator negatively feeds back the proportion voltage to the input terminal, and the first pull-up circuit is adjusted according to the proportion voltage and the first control signal, such that the resistance of each of the first pull-up units is equal to the resistance of the external resistor.

3. The calibration device of claim 1, wherein the second comparator negatively feeds back the proportion voltage to the first node, and the second pull-up circuit is adjusted according to the proportion voltage and the first control signal, such that the resistance of each of the second pull-up units is equal to the resistance of the external resistor.

4. The calibration device of claim 1, wherein the second comparator negatively feeds back the proportion voltage to the first node, and the first pull-down circuit is adjusted according to the proportion voltage and the second control signal, such that the resistance of the first pull-down circuit is equal to the resistance of the external resistor.

5. The calibration device of claim 1, wherein a number of the at least one first pull-down unit is plural, wherein the first pull-down units are coupled to each other in parallel, wherein the second comparator outputs the second control signal to the first pull-down units, such that an equivalent resistance of the first pull-down units, which are coupled to each other in parallel, is equal to the resistance of the external resistor.

6. The calibration device of claim 1, further comprising:
a third pull-up circuit, configured to receive the power supply voltage; and
a second pull-down circuit, coupled to the third pull-up circuit at a second node;
wherein the first comparator outputs the first control signal to the third pull-up circuit, such that a resistance of the third pull-up circuit is equal to the resistance of the external resistor, wherein the second comparator outputs the second control signal to the second pull-down circuit, such that a resistance of the second pull-down circuit is equal to the resistance of the external resistor.

7. The calibration device of claim 6, wherein a voltage of the second node is the proportion voltage which is corresponding to the power supply voltage.

8. The calibration device of claim 6, wherein the second pull-down circuit comprises a plurality of second pull-down units, wherein the second pull-down units are coupled to each other in parallel, wherein the second comparator outputs the second control signal to the second pull-down units, such that an equivalent resistance of the second pull-down units, which are coupled to each other in parallel, is equal to the resistance of the external resistor.

9. The calibration device of claim 1, wherein the proportion voltage is 10%~90% of the power supply voltage.

* * * * *